United States Patent
Sim et al.

(10) Patent No.: US 8,344,616 B2
(45) Date of Patent: Jan. 1, 2013

(54) ORGANIC LIGHT EMITTING DISPLAY DEVICE

(75) Inventors: Jaeho Sim, Daegu (KR); Soonkwang Hong, Daegu (KR)

(73) Assignee: LG Display Co., Ltd., Seoul (KR)

( * ) Notice: Subject to any disclaimer, the term of this patent is extended or adjusted under 35 U.S.C. 154(b) by 394 days.

(21) Appl. No.: 12/787,690

(22) Filed: May 26, 2010

(65) Prior Publication Data
US 2011/0063267 A1 Mar. 17, 2011

(30) Foreign Application Priority Data
Sep. 17, 2009 (KR) .................. 10-2009-0088240

(51) Int. Cl.
*H01J 1/62* (2006.01)
*H01L 21/28* (2006.01)
(52) U.S. Cl. ............. 313/505; 345/211; 345/76; 345/92
(58) Field of Classification Search ......... 313/505–512; 345/211, 76, 92
See application file for complete search history.

(56) References Cited

U.S. PATENT DOCUMENTS
| | | | |
|---|---|---|---|
| 2006/0231831 A1 | 10/2006 | Kim | |
| 2009/0141202 A1* | 6/2009 | Yoshida | 349/38 |
| 2009/0295273 A1 | 12/2009 | Lifka et al. | |
| 2010/0188391 A1* | 7/2010 | Kim | 345/212 |

FOREIGN PATENT DOCUMENTS
| | | |
|---|---|---|
| CN | 1856197 A | 11/2006 |
| CN | 101080950 A | 11/2007 |
| JP | 2009-157157 A | 7/2009 |
| JP | 2009-163061 A | 7/2009 |
| KR | 10-2009-0093744 A | 9/2009 |

OTHER PUBLICATIONS

First Notification of Office Action dated Sep. 11, 2012 from The State Intellectual Property Office of China in a Chinese counterpart application.

* cited by examiner

*Primary Examiner* — Joseph L Williams
(74) *Attorney, Agent, or Firm* — Morgan, Lewis & Bockius LLP

(57) ABSTRACT

Provided is an organic light emitting display device which comprises a display area defined on a substrate, the display area comprise a display part having a sub pixels, scan driver areas respectively located at the left and right sides of the display area and including scan drivers which provide scan signals to the sub pixels, dummy areas respectively defined between the display area and the scan driver areas, and a wiring areas defined outside each of the scan driver areas and including a gate line and a source/drain line which are insulated from each other by insulating layers formed on the substrate and respectively located at different layers, wherein at least one of lines disposed in the wiring areas is electrically connected to a cathode located in the display area through an anode disposed in the scan driver areas.

11 Claims, 12 Drawing Sheets

ORGANIC LIGHT EMITTING DISPLAY DEVICE

This application claims the benefit of Korean Patent Application No. 10-2009-0088240 filed on Sep. 17, 2009, which is hereby incorporated by reference.

BACKGROUND

1. Field

This document relates to an organic light emitting display device.

2. Related Art

An organic light emitting element used for an organic light emitting display device is a self-emitting element having a light emitting layer formed between two electrodes thereof, that is, a cathode and an anode. In the organic light emitting element, electrons from the cathode and holes from the anode are injected into the light emitting layer and combined to generate excitons and light is emitted when the excitons are dropped from an excited state to a ground state.

The organic light emitting display device using the organic light emitting element is classified into a top-emission type, a bottom-emission type, and a dual-emission type according to its light emitting direction and divided into a passive matrix type and an active matrix type according to its driving method.

The top-emission type organic light emitting display device includes an anode disposed at the bottom thereof and formed of ITO (Indium Tin Oxide) and a cathode located at the top thereof and formed of Al. The top-emission type organic light emitting display device has a high cathode resistance due to its thin cathode, and thus a ground voltage increases so as to raise a driving voltage and display quality is deteriorated due to uneven luminance. Accordingly, a dummy ground line was formed in a bezel area between a display and a scan driver to prevent the driving voltage from increasing and prevent the display quality from decreasing. However, a conventional dummy ground line formed in the bezel area was thick and wide, and thus the bezel area increased to result in difficulty in designing a compact display device.

SUMMARY

An aspect of this document is to provide an organic light emitting display device comprising a display area defined on a substrate, the display area comprise a display part having a sub pixels; scan driver areas respectively located at the left and right sides of the display area and including scan drivers which provide scan signals to the sub pixels; dummy areas respectively defined between the display area and the scan driver areas; and a wiring areas defined outside each of the scan driver areas and including a gate line and a source/drain line which are insulated from each other by insulating layers formed on the substrate and respectively located at different layers, wherein at least one of lines disposed in the wiring areas is electrically connected to a cathode located in the display area through an anode disposed in the scan driver areas.

BRIEF DESCRIPTION OF THE DRAWINGS

The implementation of this document will be described in detail with reference to the following drawings in which like numerals refer to like elements.

DETAILED DESCRIPTION

Hereinafter, an implementation of this document will be described in detail with reference to the attached drawings.

Figure 1:
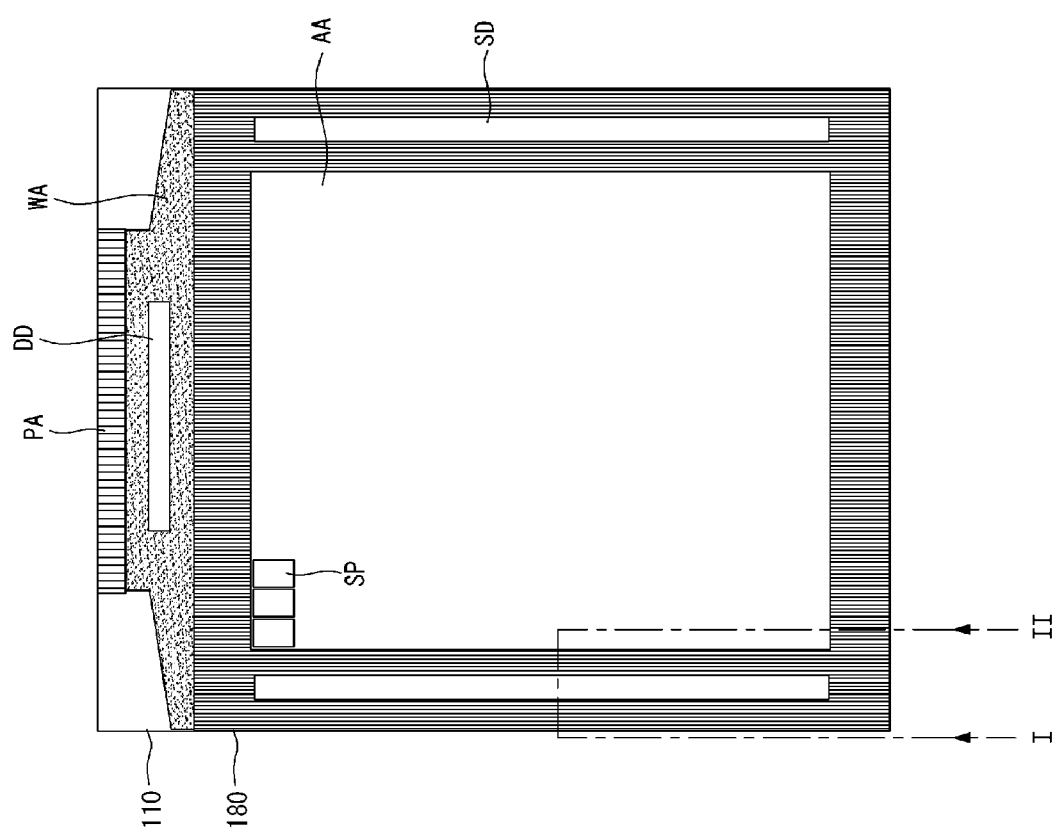
FIG. 1 is a plan view of an implementation of an organic light emitting display device.

Referring to FIG. 1, an organic light emitting display device according to an embodiment of the inventive concept comprises a substrate 110, a display part AA, a data driver DD, a scan driver SD, a pad area PA, a wiring areas WA, and a cover substrate 180 attached to the substrate 110.

The display part AA is located at the center of the substrate 110. The display part AA comprises sub pixels SP arranged in a matrix form. The sub pixels SP are connected to the data driver DD through data lines arranged in the wiring areas WA, connected to the scan driver SD through scan lines arranged in the wiring areas WA and connected to a power supply through a power line located in the wiring areas WA. The sub pixels SP may be configured in a 2T1C (2 transistors and 1 capacitor) structure including a switching transistor, a driving transistor, a capacitor and an organic light emitting diode or in a structure further including a transistor and a capacitor in addition to 2T1C.

Figure 2:
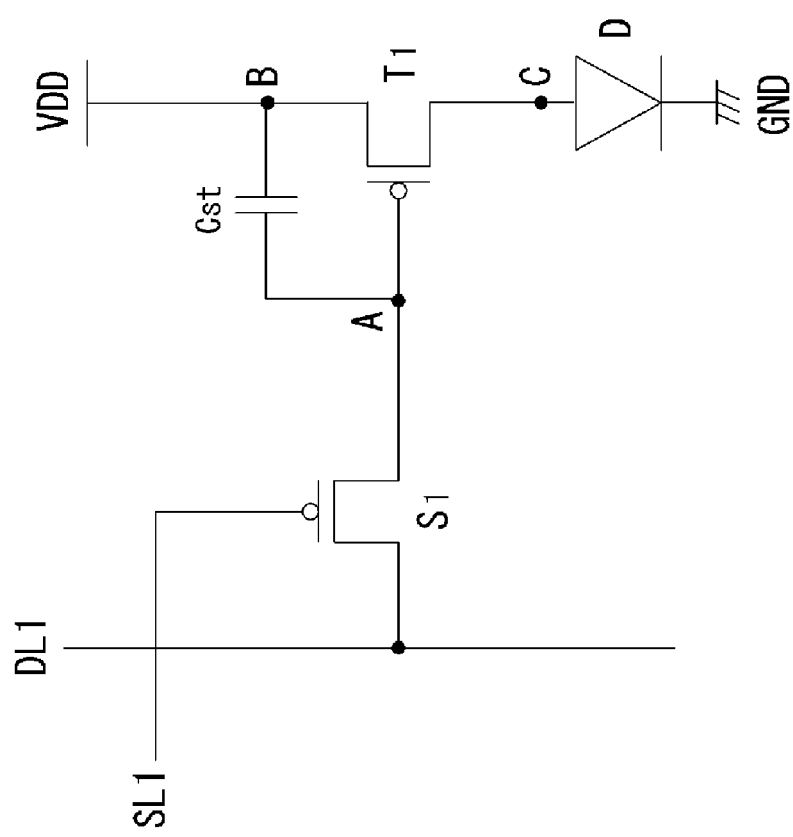
FIG. 2 is a circuit diagram of a sub-pixel.

In the 2T1C structure, elements comprised in a single sub pixel SP may be connected as shown in FIG. 2. A gate of a switching transistor S1 is connected to a scan line SL1 through which a scan signal is supplied, a first terminal of the switching transistor S1 is connected to a data line DL1 through which a data signal is supplied and a second terminal thereof is connected to a first node A. A gate of a driving transistor T1 is connected to the first node A, a first terminal of the driving transistor T1 is coupled to a second node B connected to a first power supply line VDD to which a high voltage is provided and a second terminal thereof is connected to a third node C. A first terminal of a capacitor Cst is connected to the first node A and a second terminal thereof is connected to the second node B. An anode of an organic light emitting diode D is connected to the third node C and the second terminal of the driving transistor T1 and a cathode thereof is connected to a second power supply line GND to which a low voltage is supplied.

Though the transistors S1 and T1 comprised in the sub pixel SP are P type transistors in the current description, implementations of the inventive concept are not limited thereto. The high voltage supplied through the first power supply line VDD may be higher than the low voltage supplied through the second power supply line GND. The levels of the voltages supplied through the first power supply line VDD and the second power supply line GND may be switched according to a driving method.

The operation of the aforementioned sub pixel SP will now be explained. The switching transistor S1 is turned on when the scan signal is supplied through the scan line SL1. When the data signal supplied through the data line DL1 is provided to the first node A through the turned on switching transistor S1, the data signal is stored in the capacitor Cst as a data voltage. Then, when the scan signal is cut off and the switching transistor S1 is turned off, the driving transistor T1 is driven according to the data voltage stored in the capacitor Cst. When the high voltage supplied through the first power supply line VDD is transferred to the second power supply line GND, the organic light emitting diode D emits light. This driving method is exemplary and implementations of the inventive concept are not limited thereto.

The pad area PA is located in the marginal area of the substrate 110. The pad area PA is connected to an external substrate through an anisotropic conductive film and coupled to the wiring areas WA to transmit various driving signals and power supplied from external devices to the display part AA, the data driver DD, and the scan driver SD.

The wiring areas WA transmits the driving signals and power supplied from the pad area PA to the display part AA, the data driver DD, and the scan driver SD. The wiring areas WA comprises data lines transferring data signals to the data driver DD, a clock signal line transferring a clock signal to the scan driver SD, and the power supply lines VDD and GND transferring the high voltage and low voltage to the display part AA. The power supply line transferring the low voltage is referred to as a ground line hereinafter.

The data driver DD is located between the display part AA and the pad area PA. The data driver DD is mounted in the form of an IC (Integrated Circuit) on the substrate 110. The data driver DD generates a data signal according to the driving signals supplied from the pad area PA and provides the data signal to the sub pixels SP.

The scan driver SD is disposed at the left and right sides of the display part AA. The scan driver SD is mounted in the form of GIP (Gate In Panel) on the substrate 110. The scan driver SD generates a scan signal according to the driving signals supplied from the pad area PA and provides the scan signal to the sub pixels SP.

The sub pixels SP will now be explained in more detail.

Figure 3:
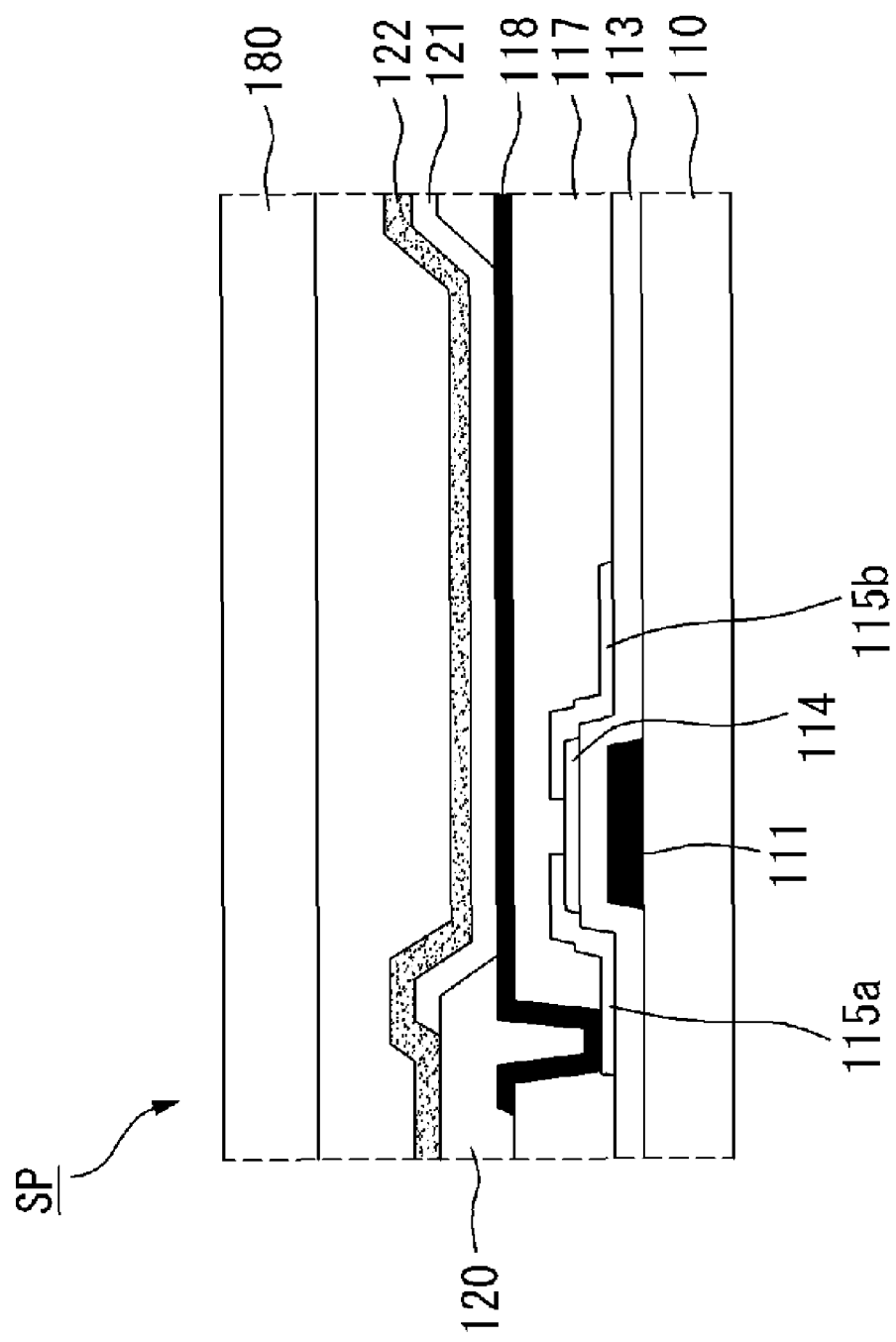
FIG. 3 is a cross-sectional view of a sub-pixel.
Figure 4:
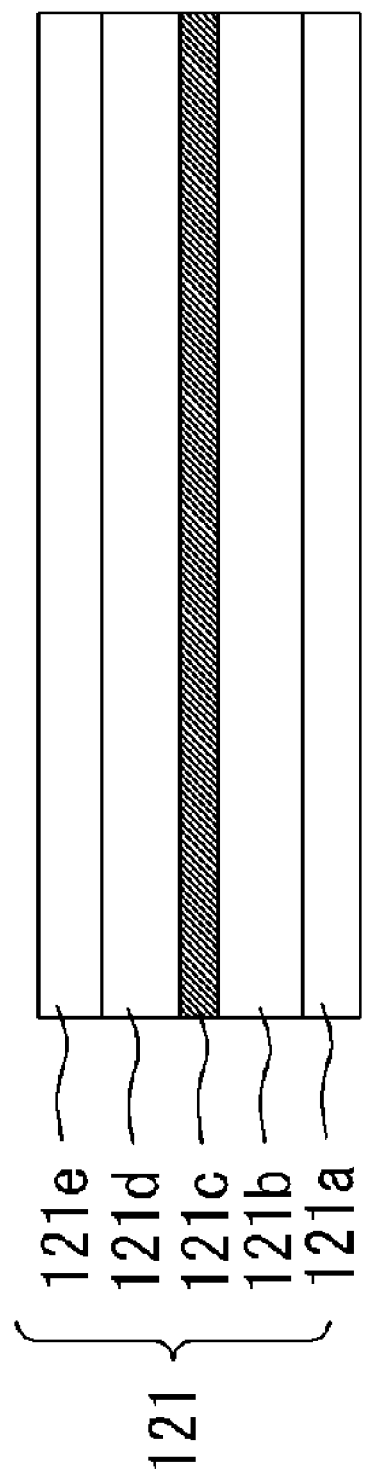
FIG. 4 is a cross-sectional view of an organic light emitting diode.

Referring to FIGS. 3 and 4, a gate electrode 111 is formed on the substrate 110. The gate electrode 111 may be formed of one selected from a group consisting of Mo, Al, Cr, Au, Ti, Ni, Nd and Cu or an alloy of these materials. The gate electrode 111 may be a multi layer formed of one selected from a group consisting of Mo, Al, Cr, Au, Ti, Ni, Nd and Cu or an alloy of these materials. Furthermore, the gate electrode 111 may be a double layer of Mo/Al—Nd or Mo/Al.

A first insulating layer 113 is formed on the gate electrode 111. The first insulating layer 113 may be formed of SiOx, SiNx or may be a multi layer formed of SiOx and SiNx.

An active layer 114 is formed on the first insulating layer 113. The active layer 114 may include amorphous silicon or polysilicon. The active layer 114 may include a channel region (not shown), a source region (not shown) and a drain region (not shown). The source and drain regions may be doped with a P type or N type impurity. Furthermore, the active layer 114 may include an ohmic contact layer for decreasing contact resistance.

A source electrode 115a and a drain electrode 115b are formed on the active layer 114. The source electrode 115 and the drain electrode 115b may be formed from a single layer or a multi layer. The source electrode 115a and the drain electrode 115b may be formed of one selected from a group consisting of Mo, Al, Cr, Au, Ti, Ni, Nd and Cu or an alloy of these materials when they are formed from a single layer. The source electrode 115a and the drain electrode 115b may be formed from a double layer of Mo/Al—Nd or a tri-level layer of Mo/Al/Mo or Mo/Al—Nd/Mo when they are formed from a multi layer.

A second insulating layer 117 is formed on the source electrode 115a and the drain electrode 115b. The second insulating layer 117 may be formed of SiOx, SiNx or may be a multi layer formed of SiOx and SiNx. However, the second insulating layer 117 is not limited thereto. The second insulating layer 117 may be a passivation layer.

A driving transistor located on the substrate 110 has been explained. An organic light emitting diode disposed on the driving transistor will now be described.

An anode 118 is formed on the second insulating layer 117. The anode 118 may be formed of a transparent material, for example, ITO or IZO (Indium Zinc Oxide). However, the material of the anode 118 is not limited thereto.

A bank layer 120 that partially exposes the anode 118 is formed on the anode 118. The bank layer 120 may be formed of an organic material such as benzocyclobutene (BCB) resin, acryl resin or polyimide resin. However, the material of the bank layer 120 is not limited thereto.

An organic emission layer 121 is formed on the anode 118 exposed through the bank layer 120. The organic emission layer 121 comprises a hole injection layer 121a, a hole transport layer 121b, an emission layer 121c, an electrode transport layer 121, and an electron injection layer 121e, as shown in FIG. 4. The hole injection layer 121a may permit smooth injection of holes and be formed of one or more selected from a group consisting of CuPc (Copper Phthalocyanine), PEDOT (Poly(3,4)-ethylenedioxythiophene), PANI (Polyaniline) and NPD (N,N-dinaphthyl-N,N'-diphenyl benzidine). However, the material of the hole injection layer 121a is not limited thereto. The hole transport layer 121b may perform smooth transport of holes and be formed of one or more selected from a group consisting of NPD (N,N-dinaphthyl-N,N'-diphenyl benzidine), TPD (N,N'-bis-(3-methylphenyl)-N,N'-bis-(phenyl)-benzidine), s-TAD and MTDATA (4, 3', 4"-Tris(N-3-methylphenyl-N-phenyl-amino)-triphenylamine). However, the material of the hole transport layer 121b is not limited thereto. The emission layer 121c comprises a host and a dopant. The emission layer 121c may include materials emitting green, blue and white lights and may be formed using a phosphorescent material or a fluorescent material. If the emission layer 121c emits red light, the emission layer 121c has a host material including CBP (carbazol biphenyl) or mCP (1,3-bis(carbazol-9-yl) and may be formed of a phosphorescent material having a dopant including one or more selected from a group consisting of PIQIr (acac) (bis(1-phenylisoquinoline) acetylacetonate iridium), PQIr (acac) (bis(1-phenylisoquinoline) acetylacetonate irium), PQIr (tris(1-phenylquinoline)iridium) and PtOEP (octaethylporphyrin platinum). Otherwise, the emission layer 121c emitting red light may be formed of a fluorescent material including PBD: Eu(DBM)3(Phen) or Perylene. However, the material of the emission layer 121c emitting red light is not limited thereto. If the emission layer 121c emits green light, the emission layer 121c has a host material including CBP or mCP and may be formed of a phosphorescent material having a dopant including Ir(ppy)3(fac tris(2-phenylpyridine)iridium). Otherwise, the emission layer 121c emitting green light may be formed of a fluorescent material including Alq3(tris(8-hydroxyquinolino)aluminum). However, the material of the emission layer 121c emitting green light is not limited thereto. If the emission layer 121c emits blue light, the emission layer 121c has a host material including CBP or mCP and may be formed of a phosphorescent material having a dopant including (4,6-F2 ppy)2Irpic. Otherwise, the emission layer 121c emitting blue light may be formed of a fluorescent material including one selected from a group consisting of spiro-DPVBi, spiro-6P, DSB, DSA, PFO polymer and PPV polymer. However, the material of the emission layer 121c emitting blue light is not limited thereto. The electron transport layer 121d permits smooth transport of electrons and may be formed of a material selected from Alq3(tris(8-hydroxyquinolino)aluminum), PBD, TAZ, Spiro-PBD, BAlq and SAlq. However, the material of the electron transport layer 121d is not limited thereto. The electron injection layer 121e allows smooth injection of electrons and may be formed of Alq3(tris(8-hydroxyquinolino)aluminum), PBD, TAZ, LiF, Spiro-PBD, BAlq or SAlq. However, the material of the electron injection layer 121e is not limited thereto. Embodiments of the inventive concept are not limited to the structure of FIG. 4 and at least one of the hole injection layer 121a, the hole transport layer 121b, the electron transport layer 121d and the electron injection layer 121e may be omitted or other functional layers may be added. Meanwhile, the hole injection layer 121a, the hole transport layer 121b, the electrode transport layer 121, and the electron injection layer 121e are defined in a common layer. However, the common layer is not limited thereto.

A cathode 122 is formed on the organic emission layer 121. The cathode 122 may be formed of Al or AlNd. However, the material of the cathode 122 is not limited thereto.

The organic light emitting display device having the above-described sub pixel structure is a top-emission type organic light emitting display device that displays images in the direction of the cathode 122 formed of a transparent material.

The organic light emitting display device shown in FIG. 1 will now be explained in more detail.

Referring to FIGS. 1 through 5, a display area AAA, a dummy area DMA, a scan driver area SDA, a wiring area DWA and an edge area EDA are defined on the substrate 110. Here, the dummy area DMA, the scan driver area SDA, the wiring area DWA and the edge area EDA are defined as a bezel area.

The display area AAA displays images. The display part AA including the sub pixels SP arranged in a matrix form is located in the display area AAA. The cathode 122 is disposed on the display part AA. The cathode 122 located on the display part AA is formed of the same material as the cathode 122 of the sub pixels SP through the same process of forming the cathodes 122 of the sub pixels SP. The cathode 122 is commonly formed on the display area AAA.

The scan driver area SDA is defined at the left and right sides of the display area AAA. The scan driver SD that supplies a scan signal to the sub pixels SP comprised in the display part AA is located in the scan driver area SDA. An anode 119 is disposed on the scan driver SD. The anode 119 on the scan driver SD is formed of the same material as the anode 118 of the sub pixels SP through the same process of forming the anode 118 of the sub pixels SP. However, the anode 119 located on the scan driver SD is not electrically connected to the anode 118 of the sub pixels SP.

Figure 5:
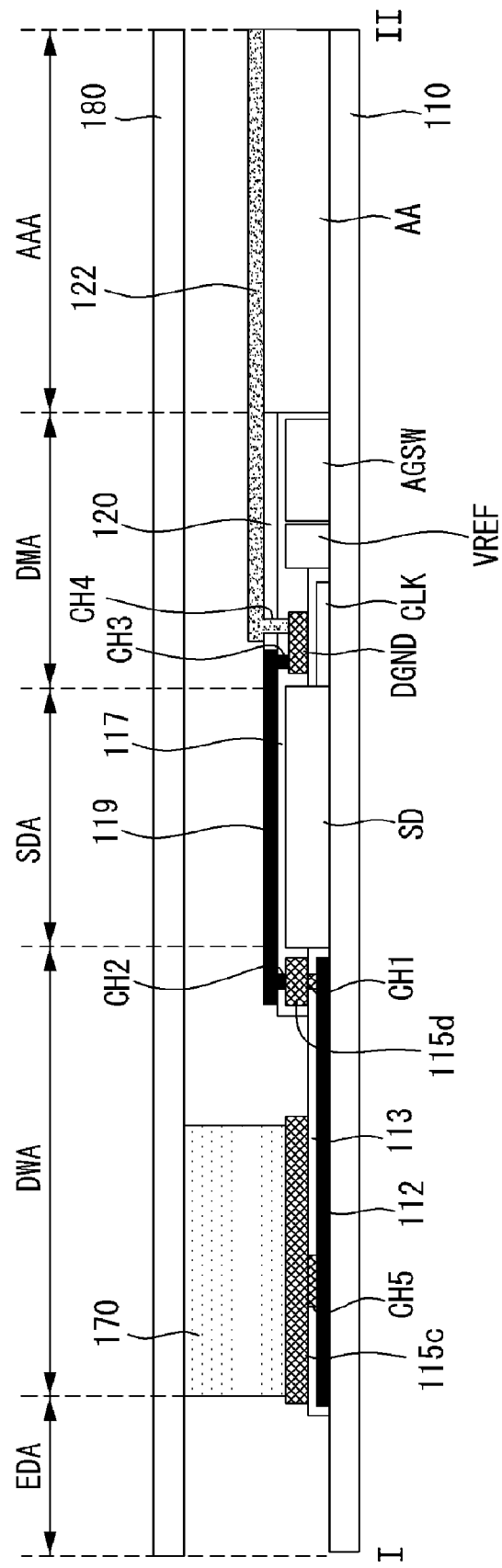
FIG. 5 is a cross-sectional view of region I-II shown in FIG. 1 according to an embodiment of the inventive concept.

The dummy area DMA is defined between the display area AAA and the scan driver area SDA. A clock signal line CLK that provides a clock signal supplied from an external device to the scan driver SD is located in the dummy area DMA. Furthermore, an aging switch AGSW for aging the sub pixels SP according to driving signals supplied from external devices and a reference line VREF for supplying a reference voltage to the aging switch AGSW may be located in the dummy area DMA. The first insulating layer 113 is located on the clock signal line CLK and a dummy ground line DGND connected to the ground line comprised in the wiring area WA is located on the first insulating layer 113. The dummy ground line DGND is located outside an area in which the emission layers and common layers of the sub pixels SP comprised in the display part AA are formed. The area in which the emission layers and the common layers of the sub pixels SP are formed is located adjacent to the scan driver area SDA, as shown in FIG. 5. The second insulating layer 117 is disposed on the dummy ground line DGND and the bank layer 120 is located on the second insulating layer 117.

The wiring area DWA is defined outside the scan driver area SDA. The wiring area DWA comprises a gate line 112 and source/drain lines 115c and 115d which are insulated from each other by the insulating layers 113 and 117 formed on the substrate 110 and located at different layers. The gate line 112 may be formed of the same material as the gate electrode 111 comprised in the sub pixels SP through the same process of forming the gate electrode 111. However, the gate line 112 is not limited thereto. The gate line 112 and the gate electrode 111 are not electrically connected to each other. The source/drain lines 115c and 115d may be formed of the same material as the source/drain electrodes 115a and 115b through the same process of forming the source/drain electrodes 115a and 115b. However, the source/drain lines 115c and 115d are not limited thereto. The source/drain lines 115c and 115d are not electrically connected to the source/drain electrodes 115a and 115b. The source/drain lines 115c and 115d include the first source/drain line 115c disposed in an area corresponding to a attaching member 170 and the second source/drain line 115d located adjacent to the scan driver SD.

Figure 6:
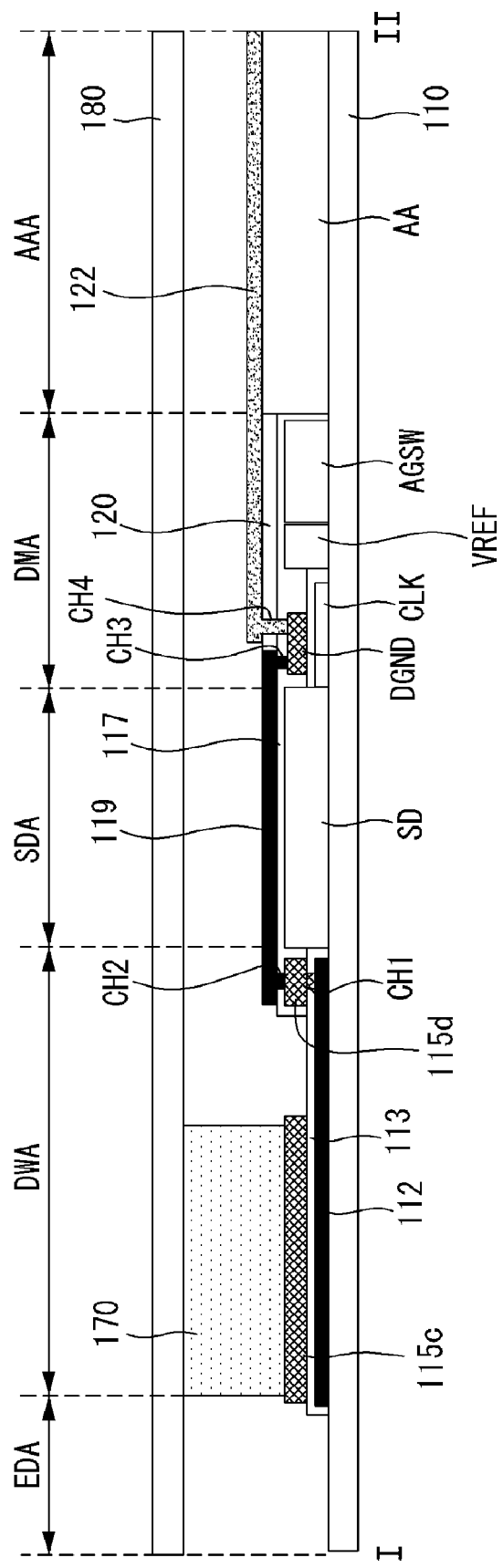
FIGS. 6 and 7 are cross-sectional views of modified implementations of the organic light emitting display device shown in FIG. 1.
Figure 7:
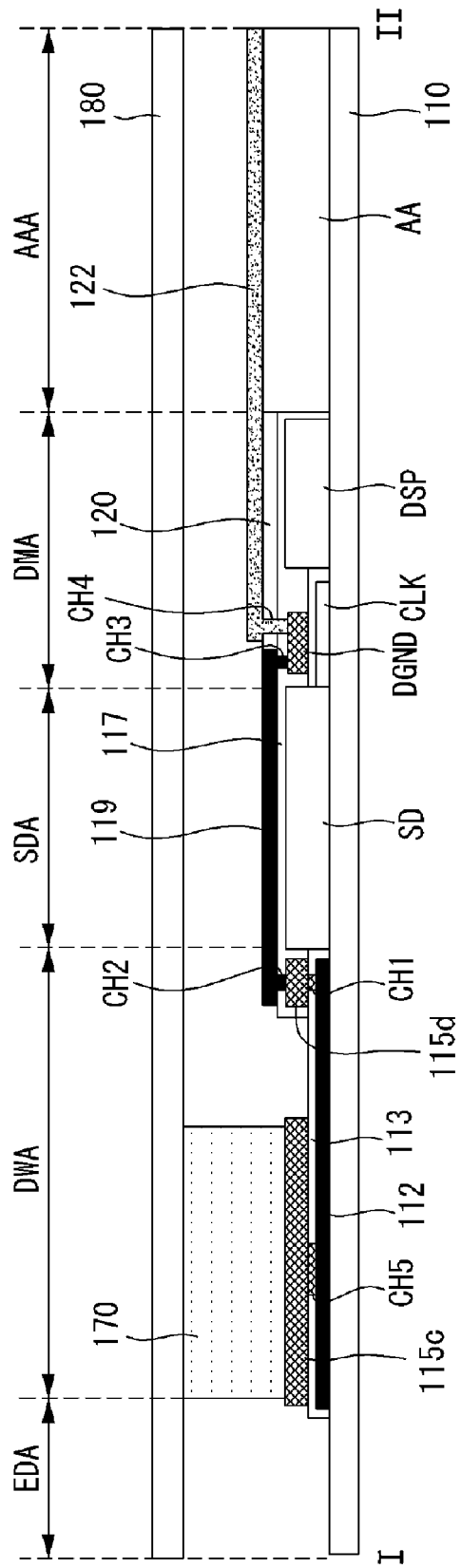

In the above-described structure, at least one of the lines located in the wiring area DWA is electrically connected to the cathode 122 located in the display area AAA through the anode 119 disposed in the scan driver area SDA. More specifically, the gate line 112 located in the wiring area DWA and the second source/drain line 115d are connected to each other through a first contact hole CH1 formed in the first insulating layer 113. The second source/drain line 115d disposed in the wiring area DWA and the anode 119 located in the scan driver area SDA are connected to each other through a second contact hole CH2 formed in the second insulating layer 117. The anode 119 located in the scan driver area SDA and the dummy ground line DGND disposed in the dummy area DMA are connected to each other through a third contact hole CH3 formed in the second insulating layer 117. The dummy ground line DGND located in the dummy area DMA and the cathode 122 placed on the display part AA are connected to each other through a fourth contact hole CH4 formed in the second insulating layer 117 and the bank layer 120. Here, the cathode 122 located on the display part AA is extended to the edge of the dummy area DMA, that is, the scan driver area SDA located adjacent to the scan driver SD, to be connected to the dummy ground line DGND. The area adjacent to the scan driver SD may be an area in which a common layer or an organic material comprised in the organic emission layer is not formed. The gate line 112 located in the wiring area DWA and the first source/drain line 115c may be connected to each other through a fifth contact hole CH5 formed in the first insulating layer 113. The connection of the gate line 112 and the first source/drain line 115c may be used to form a thermal conductive path when the attaching member 170 is formed of frit. However, the connection of the gate line 112 and the first source/drain line 115c may be omitted, as shown in FIG. 6. Furthermore, a dummy pixel DSP instead of the aging switch SGSW and the reference line VREF shown in FIGS. 5 and 6 may be formed in the dummy area DMA, as shown in FIG. 7.

The structure shown in FIG. 5 is compared with a comparative example.

Figure 8:
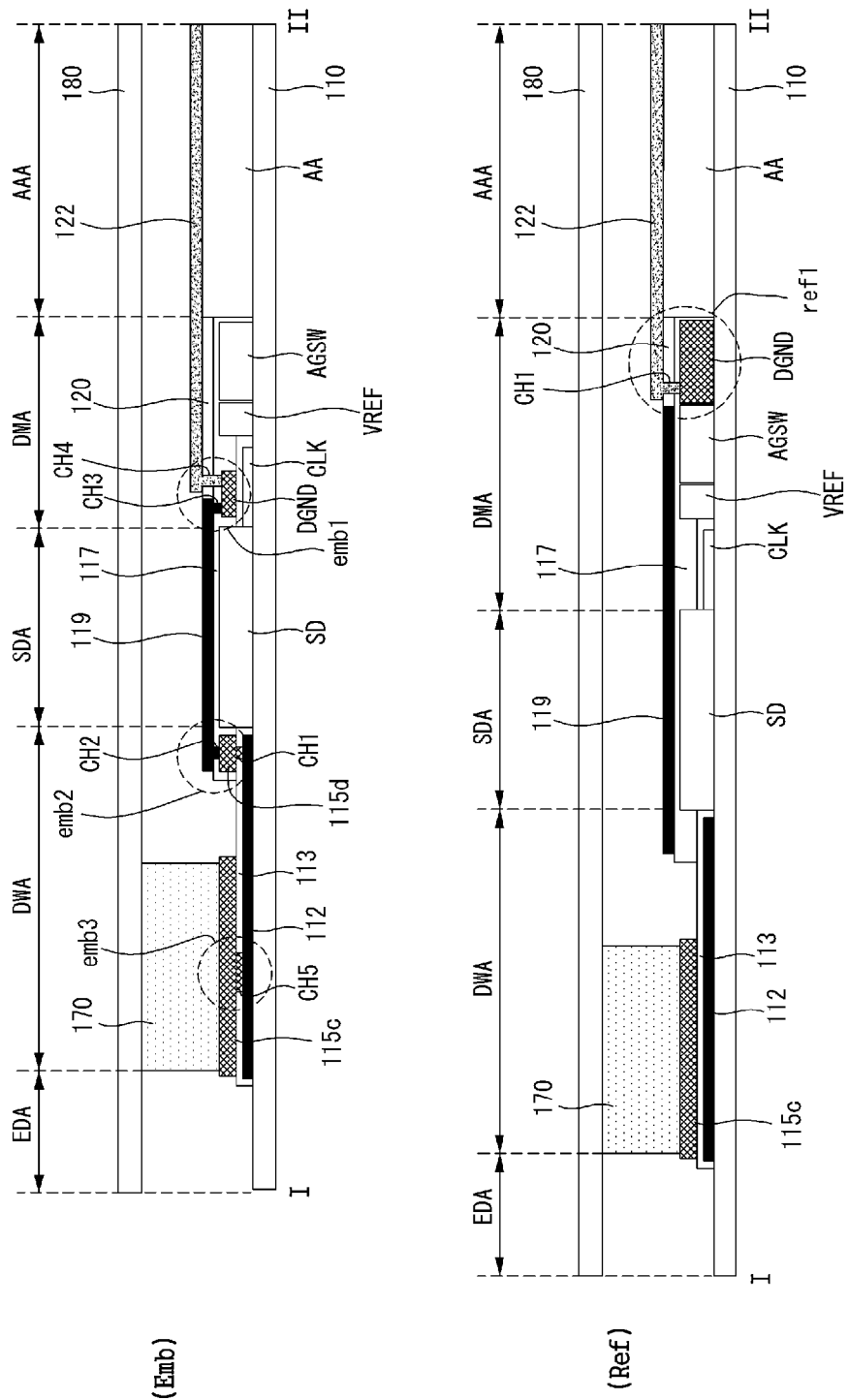
FIG. 8 are views for comparing the implementation shown in FIG. 5 with a comparative example.

Referring to dotted line circle ref1 of FIG. 8, in the structure of the comparative example, the dummy ground line DGND is formed wide and thick in the dummy area DMA to reduce the resistance of the cathode 122 used as a transparent electrode. The dummy ground line DGND formed in the dummy area DMA is connected to the cathode 122 located in the display part AA.

Referring to three dotted line circles emb1, emb2 and emb3 of FIG. 8, the dummy ground line DGND is formed on the clock signal line CLK located in the dummy area DMA to decrease the resistance of the cathode 122 used as a transparent electrode. The cathode 122 located in the display area AAA is connected to the dummy ground line DGND disposed in the dummy area DMA, the anode 119 located in the scan driver area SDA, and the gate line 112 placed in the wiring area DWA. That is, the dummy ground line DGND located on the substrate 110 in the dummy area DMA is formed on the clock signal line CLK in the embodiment, and thus the bezel area can become smaller than the bezel area in the structure of the comparative example. Furthermore, the cathode 122 located in the display area AAA is extended to the gate line 112 located in the wiring area DWA in the embodiment, and thus the resistance of the cathode 122 can be reduced as compared to the comparative example.

Figure 9:
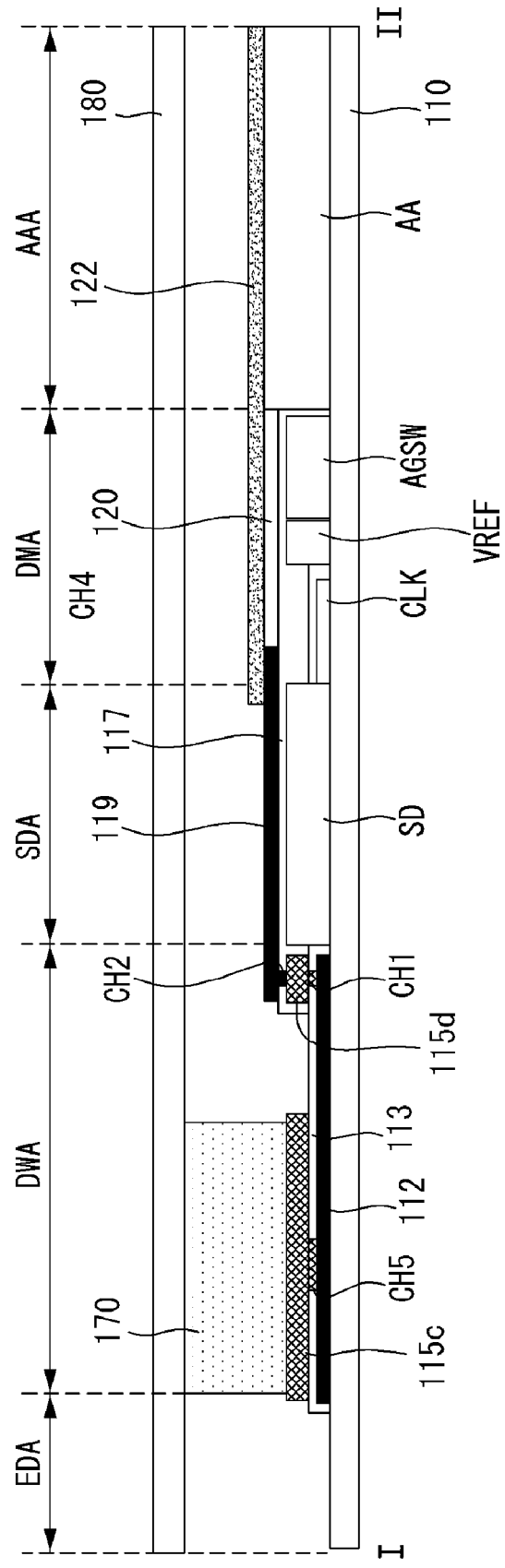
FIG. 9 is a cross-sectional view of region I-II shown in FIG. 1 according to another embodiment of the inventive concept.

Referring to FIGS. 1 and 9, the display area AAA, the dummy area DMA, the scan driver area SDA, the wiring area DWA and the edge area EDA are defined on the substrate 110. Here, the dummy area DMA, the scan driver area SDA, the wiring area DWA and the edge area EDA are defined as a bezel area.

In the current embodiment, the second source/drain line 115d connected to the anode 119 is coupled to the ground line located in the wiring area WA, and thus the dummy ground line is omitted, which is different from the aforementioned embodiment shown in FIG. 5. Furthermore, the cathode 122 located on the display part AA is extended to the scan driver area SDA to directly come into contact with the anode 119. Accordingly, the process may be simplified as compared to the aforementioned embodiment.

Figure 10:
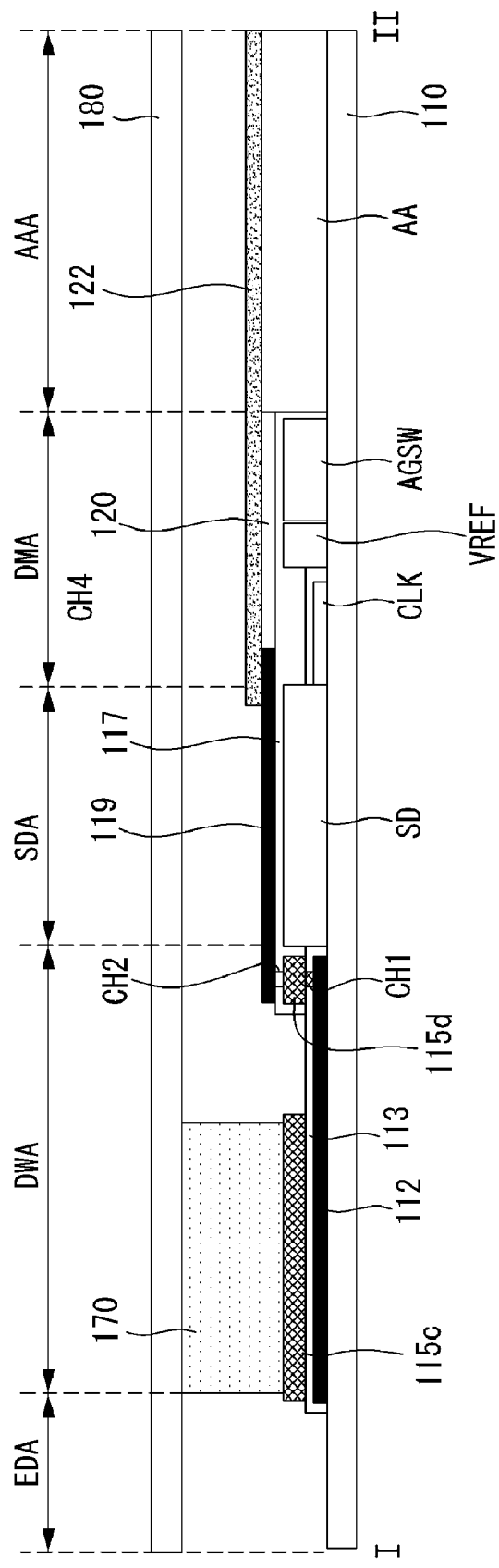
FIGS. 10, 11 and 12 are cross-sectional views of modified implementations of the structure shown in FIG. 9.

The gate line 112 located in the wiring area DWA and the first source/drain line 115c may be connected to each other through the fifth contact hole CH5 formed in the first insulating layer 113. The connection of the gate line 112 and the first source/drain line 115c may be used to form a thermal conductive path when the attaching member 170 is formed of frit. However, the connection may be omitted as shown in FIG. 10.

Figure 11:
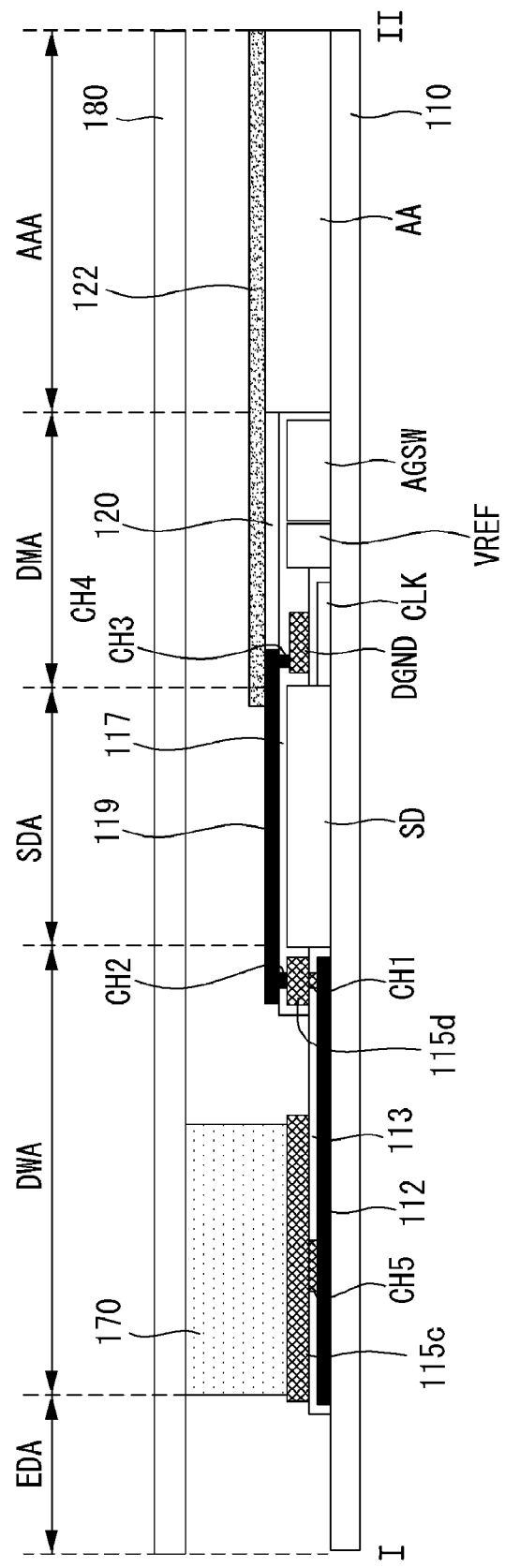
Figure 12:
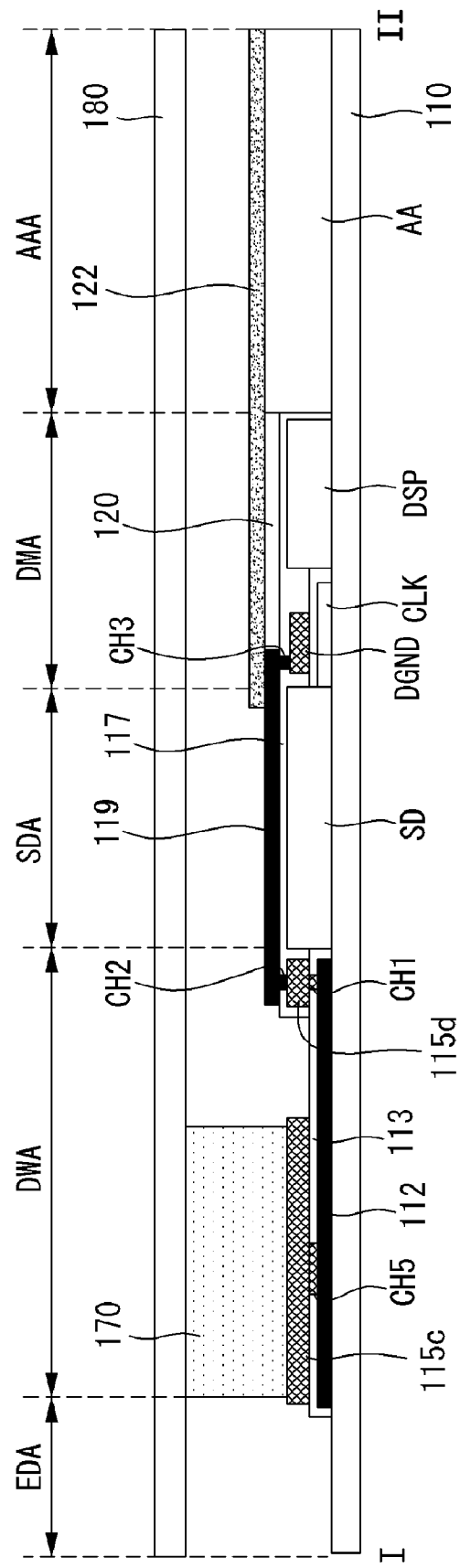

Furthermore, the dummy ground line DGND may be formed in the dummy area DMA, as show in FIG. 11. Moreover, the dummy pixel DSP instead of the aging switch AGSW and the reference line VREF shown in FIGS. 9, 10 and 11 may be located in the dummy area DMA, as shown in FIG. 12.

As described above, this document provides the top-emission type organic light emitting display device capable of reducing the resistance of the cathode used as a transparent electrode to prevent the driving voltage from increasing or prevent display quality from being deteriorated due to uneven luminance. Furthermore, the structure of the dummy ground line used to reduce the resistance of the cathode can be modified to reduce the bezel area so as to design a compact display device. Moreover, a thermal conductive path is formed in a sealing area in which the attaching member is formed, and thus it is possible to prevent characteristics of a display panel from being deteriorated due to a high process temperature required for frit.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An organic light emitting display device comprising:
  a display area defined on a substrate, the display area comprise a display part having a sub pixels;
  scan driver areas respectively located at the left and right sides of the display area and including scan drivers which provide scan signals to the sub pixels;
  dummy areas respectively defined between the display area and the scan driver areas; and
  a wiring areas defined outside each of the scan driver areas and including a gate line and a source/drain line which are insulated from each other by insulating layers formed on the substrate and respectively located at different layers,
  wherein at least one of lines disposed in the wiring areas is electrically connected to a cathode located in the display area through an anode disposed in the scan driver areas.

2. The organic light emitting display device of claim 1, further comprising a dummy ground line located in the dummy areas and formed of the same material as the source/drain line,
  wherein the anode and the cathode are electrically connected to each other through the dummy ground line.

3. The organic light emitting display device of claim 2, wherein the dummy ground line is located outside an area in which emission layer and common layer of the sub pixels arranged in the display part are formed.

4. The organic light emitting display device of claim 1, wherein the source/drain line comprises a first source/drain line and a second source/drain line located adjacent to the scan driver areas, the gate line is connected to the second source/drain line through a first contact hole formed in a first insulating layer covering the gate line, and the second source/drain line is connected to the anode through a second contact hole formed in a second insulating layer covering the second source/drain line.

5. The organic light emitting display device of claim 2, wherein the anode is connected to the dummy ground line through a third contact hole formed in the second insulating layer covering the dummy ground line and the cathode is connected to the dummy ground line through a fourth contact hole formed in the second insulating layer and a third insulating layer which cover the dummy ground line.

6. The organic light emitting display device of claim 4, wherein the gate line is connected to the first source/drain line through a fifth contact hole formed in the first insulating layer covering the gate line.

7. The organic light emitting display device of claim 5, wherein the cathode is extended to an area adjacent to the scan driver areas.

8. The organic light emitting display device of claim 6, wherein a attaching member is formed on the first source/drain line.

9. The organic light emitting display device of claim 1, wherein the cathode is extended to the tops of the scan driver areas to be electrically connected to the anode.

10. The organic light emitting display device of claim 9, wherein the source/drain line comprises the first source/drain line and the second source/drain line located adjacent to the scan driver areas and the second source/drain line is connected to a ground line to which a low voltage is supplied.

11. The organic light emitting display device of claim 1, wherein the dummy areas comprises at least one of a clock signal line that transfers a clock signal supplied from an external device to the scan drivers, an aging switch for aging the sub pixels, and a dummy pixel formed in a structure similar to the sub pixels.

\* \* \* \* \*